United States Patent [19]

Atherton

[11] 4,439,738
[45] Mar. 27, 1984

[54] CLASS D PULSE WIDTH MODULATED AMPLIFIER

[75] Inventor: Jay W. Atherton, Seattle, Wash.

[73] Assignee: Honeywell Inc., Minneapolis, Minn.

[21] Appl. No.: 320,287

[22] Filed: Nov. 12, 1981

[51] Int. Cl.³ .............................................. H03F 3/38
[52] U.S. Cl. ................................. 330/10; 330/207 A
[58] Field of Search ................... 330/10, 207 A, 251, 330/276; 328/67; 363/41

[56] References Cited
U.S. PATENT DOCUMENTS
4,092,610 5/1978 White et al. ...................... 330/10 X Primary Examiner—James B. Mullins
Attorney, Agent, or Firm—George W. Field

[57] ABSTRACT

An arrangement for improving the performance of Class D pulse width modulated amplifiers which comprises circuitry for short circuiting turns on the output transformer during intervals between pulses and thus enabling extended linear control of the power output of said amplifier and protecting the amplifier against transients fed back from a load connected thereto.

1 Claim, 2 Drawing Figures

CLASS D PULSE WIDTH MODULATED AMPLIFIER

TECHNICAL FIELD

This invention relates to the field of electrical engineering, and particularly to the design of amplifying equipment having output signal linear power control at high power levels, using ground reference push pull amplification with class D pulse width modulation (PWM).

BACKGROUND OF THE INVENTION

The high power efficiency of class D push-pull amplifiers is well known, and it is also known that in order to achieve an ideal 3-state PWM output signal, a low impedance return path must be provided, during periods when neither of the push-pull amplifiers is conductive, for energy stored in magnetic and capacitive components of the load on the equipment.

This has been done to some degree by use of snubbing networks, which dissipate excessive power, or by use of high voltage transistors selectively activated and configured in a conventional amplifier bridge circuit, but additionally having somewhat involved drive requirements due to ground reference conditions.

SUMMARY OF THE INVENTION

The present invention comprises a less expensive and simpler arrangement, which uses a low voltage, moderate current bi-directional switch, referenced to ground, in connection with a winding of the output transformer, which switch acts as a transformer turn shorting switch, the resulting "reflected" low impedance causing the transformer output to be essentially of an ideal PMW waveform.

Various advantages and features of novelty which characterize the invention are pointed out with particularity in the claims annexed hereto and forming a part hereof. However, for a better understanding of the invention, its advantages, and objects obtained by its use, reference should be had to the drawing which forms a further part hereof, and to the accompanying descriptive matter, in which there is illustrated and described a preferred embodiment of the invention.

BRIEF DESCRIPTION OF THE DRAWING

In the drawing, in which like reference numerals indicate corresponding parts throughout the several views.

DESCRIPTION OF THE PREFERRED EMBODIMENT

Figure 1:
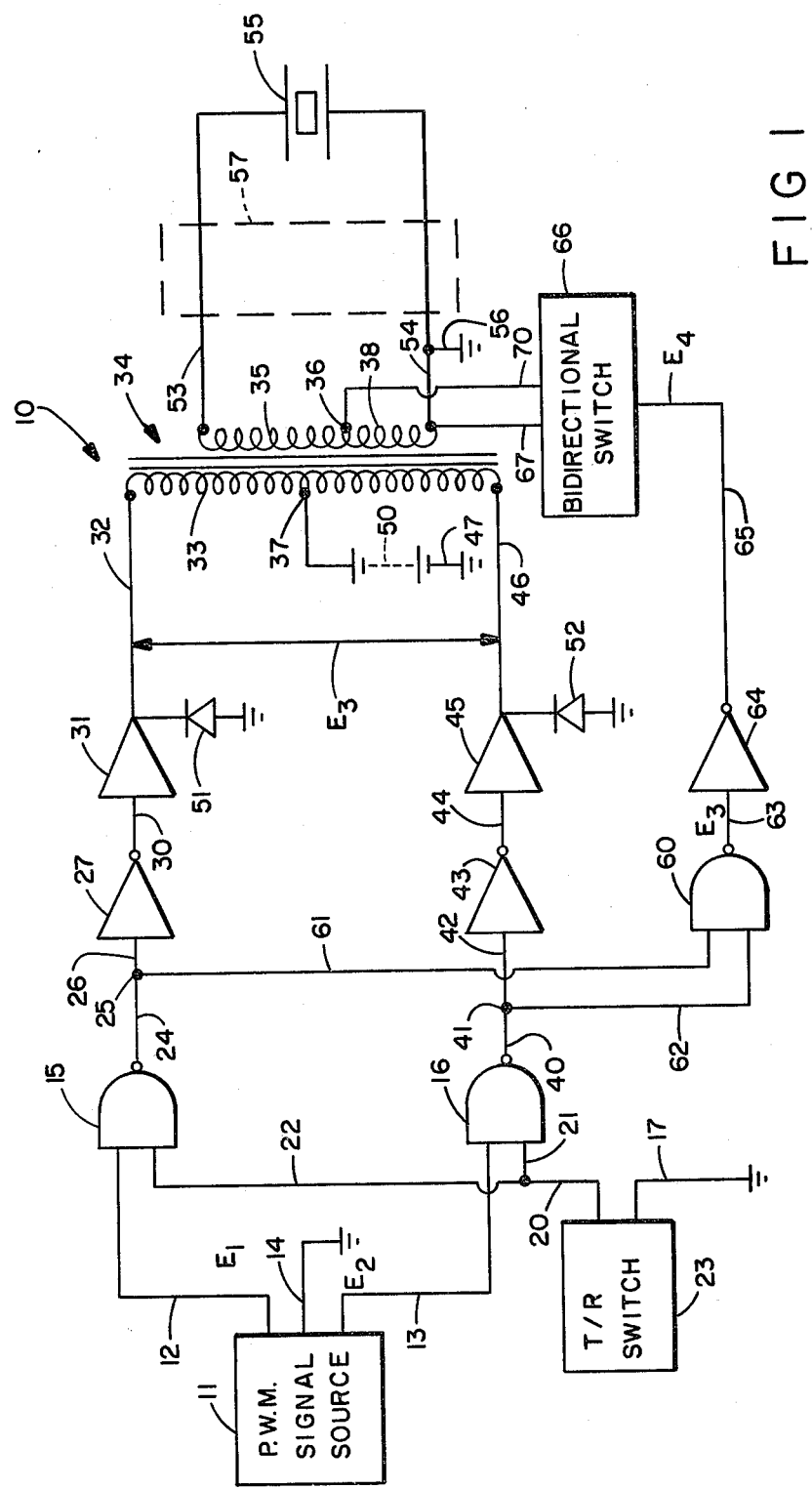
FIG. 1 is a functional diagram of amplifying equipment according to the invention.

A "Class D" amplifier 10 according to the invention is shown in FIG. 1 as receiving, from a pulse width modulated source 11, a signal on conductors 12 and 13 with respect to ground 14. The signal comprises a pair of trains $E_1$ and $E_2$ of alternate pulses having a common repetition period or frequency, the pulses being of equal amplitude and of concurrently variable widths less than half the repetition period.

A pair of logical NAND circuits 15 and 16, having first inputs on conductors 12 and 13, receive second inputs with respect to ground 17 on conductors 20, 21 and 22 from a transmit/receive switch 23, during intervals when transmission of the PMW signal is intended.

The output from NAND circuit 15 is supplied through conductor 24, junction point 25, conductor 26, inverter circuit 27, conductor 30, amplifier 31, and conductor 32 to one terminal of the primary winding 33 of an output transformer 34 having a secondary winding 35 tapped at 36: primary winding 33 is center tappd at 37.

The output of NAND circuit 16 is supplied through conductor 40, junction point 41, conductor 42, inverter circuit 43, conductor 44, amplifier 45, and conductor 46 to the other terminal of primary winding 33. Center tap 37 is maintained positive with respect to ground 47 by a direct voltage source 50. Amplifiers 31 and 45 are provided with protective diodes 51 and 52.

Secondary winding 35 is connected by conductors 53 and 54 to energize a load 55, shown as a piezoelectric or magnetostrictive transducer. Conductor 54 is grounded to 56, and conductors 53 and 54 may include a tuned circuit 57 if it is desired.

A further logical NAND circuit 60 is connected to junctions 25 and 41 by conductors 61 and 62. Its output is supplied through conductor 63, inverter circuit 64, and conductor 65 to control a bi-directional switch 66, connected by conductors 67 and 70 to tap 36 and one terminal of secondary winding 35, so that when the switch is energized a portion 38 of winding 25 is short-circuited so as to utilize energy reflected from the load impedance.

Figure 2:
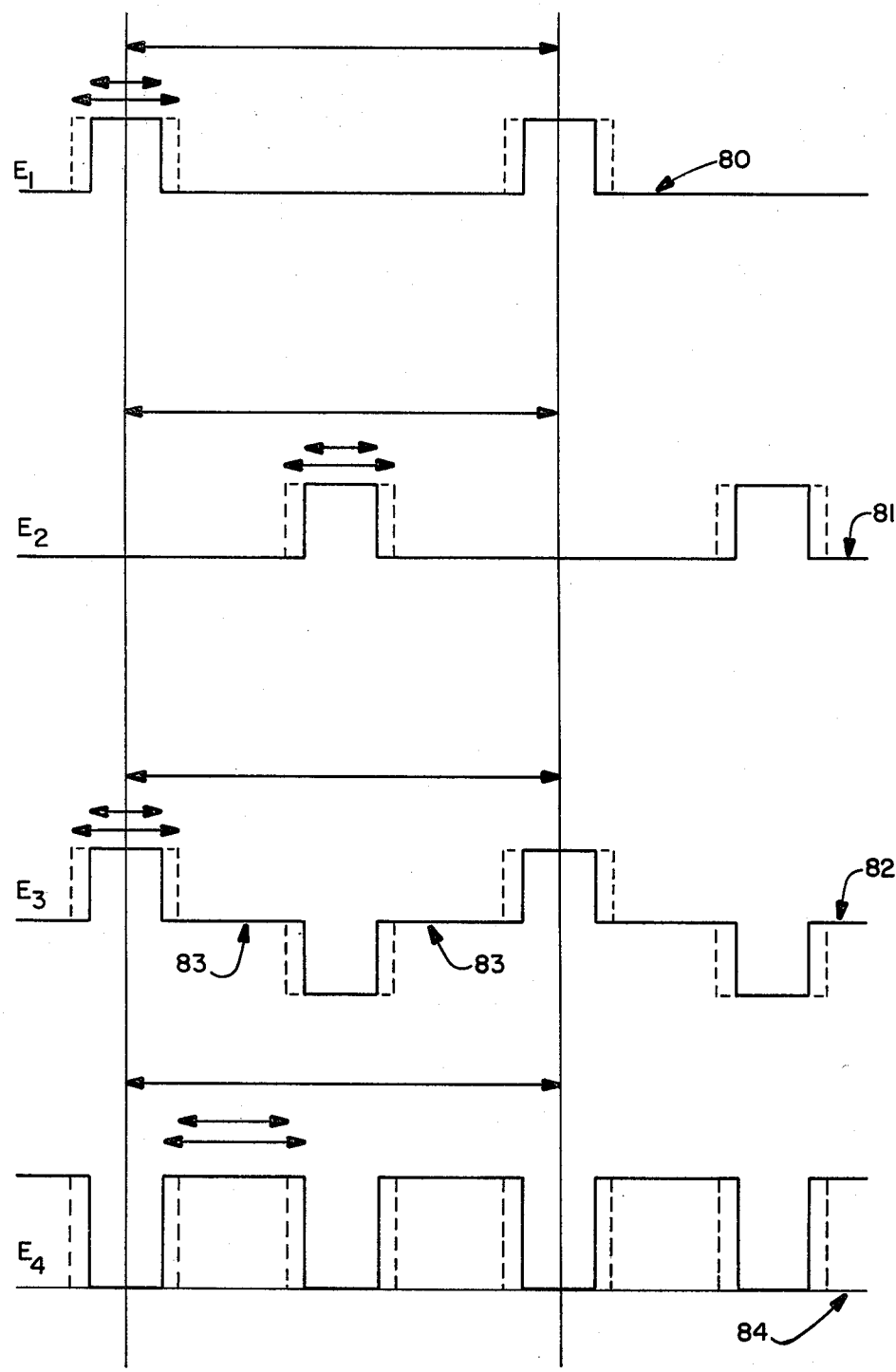
FIG. 2 is a diagram showing time relationships between voltages present during operation of the equipment.

Referring now to FIG. 2, curves 80 and 81 show the wave forms of pulse trains $E_1$ and $E_2$. Curve 82 shows the resulting ideal wave form across primary winding 33. It is apparent that there are portions of the period, indicated at 83, during which the transformer is not energized from either pulse train.

Whenever there is a signal on conductor 61 from pulse train $E_1$, or on conductor 62 from pulse train $E_2$, NAND circuit 60 gives a logic high output. When both pulses are absent, that is, during intervals 83 of curve 82, NAND circuit 60 gives a logic low output to inverter circuit 64 which provides closure of switch 66 and short-circuits portion 38 of winding 35. This results in a low impedance circuit connected to load 55: the intervals of switch closure are shown in curve 84 of FIG. 2, and energy stored in load 55 during the pulses may dissipate through secondary winding 35 while the shorted turns portion 38 maintain a low impedance path. This arrangement enables the operation of the system at a higher power level, since there are no transients of reverse energy to affect the equipment. It has a further advantage, when load 55 is a transducer, of suppressing any signals generated by the transducer during explosive shock conditions and preventing them from being fed back into the amplifier and destroying components.

While the drawing shows switch 66 as short-circuiting a portion of secondary winding 35 referenced to ground, it will be understood that an independent isolated winding can also be provided on transformer 34 for this purpose if desired.

From the foregoing there will be evidence the invention comprises an improved Class D amplifier for pulse width modulated signals in which a low impedance path is created in the output transformer during intervals when the primary winding is not being energized, thus enabling higher levels of power operation and suppressing reverse signals from the output transformer.

Numerous characteristics and advantages of the invention have been set forth in the foregoing description, together with details of the structure and function of the invention, and the novel features thereof are pointed out in the appended claims. The disclosure, however, is illustrative only, and changes may be made in detail, especially in matters of shape, size and arrangement of parts, within the principle of the invention, to the full extent indicated by the broad general meaning of the terms in which the appended claims are expressed.

I claim:

1. A ground referenced push-pull amplifier having a pair of inputs and including an output transformer, having primary and secondary windings, energizing a load;
   a transducer conductively connected directly to said secondary winding;
   means supplying to said inputs a pulse width modulated signal comprising a pair of trains of alternate pulses having a common repetition period, said pulses being of equal magnitude and of concurrently variable widths less than half of said repetition period;
   and means connected to the first named means short-circuiting turns of said secondary winding during intervals between successive pulses of said signal, whereby to protect said amplifier against said transients fed back from said load during said intervals.

* * * * *